United States Patent
Chiu et al.

(10) Patent No.: US 7,205,485 B2
(45) Date of Patent: Apr. 17, 2007

(54) PRINTED CIRCUIT BOARD AND METHOD FOR FABRICATING THE SAME

(75) Inventors: Chin-Tien Chiu, Taichung (TW); Chin-Huang Chang, Taichung (TW); Chih-Ming Huang, Taichung (TW)

(73) Assignee: Siliconware Precision Industries Co., Ltd., Tantzu, Taichung (TW)

( * ) Notice: Subject to any disclaimer, the term of this patent is extended or adjusted under 35 U.S.C. 154(b) by 8 days.

(21) Appl. No.: 10/831,247

(22) Filed: Apr. 23, 2004

(65) Prior Publication Data

US 2004/0262033 A1 Dec. 30, 2004

(30) Foreign Application Priority Data

Jun. 30, 2003 (TW) .............................. 92117778 A

(51) Int. Cl.
*H05K 1/16* (2006.01)
(52) U.S. Cl. ...................................... 174/260; 174/262
(58) Field of Classification Search ............... 174/260, 174/261, 262; 361/760, 763, 765, 766, 767, 361/782; 257/789, 787, 737, 778, 738
See application file for complete search history.

(56) References Cited

U.S. PATENT DOCUMENTS

| | | | |
|---|---|---|---|
| 5,266,748 A * | 11/1993 | Kawakami et al. ......... 174/262 |
| 6,084,782 A * | 7/2000 | Huynh et al. ............... 361/777 |
| 6,153,930 A * | 11/2000 | Hori ........................... 257/687 |
| 6,338,767 B1 * | 1/2002 | Nakatani et al. ........... 156/233 |
| 6,515,842 B1 * | 2/2003 | Hayworth et al. .......... 361/303 |
| 6,521,997 B1 * | 2/2003 | Huang et al. ............... 257/737 |
| 6,566,611 B2 * | 5/2003 | Kochanowski et al. ..... 174/261 |
| 6,774,493 B2 * | 8/2004 | Capote et al. .............. 257/778 |
| 6,836,022 B2 * | 12/2004 | Boone et al. ............... 257/778 |

* cited by examiner

*Primary Examiner*—Ishwar Patel

(57) ABSTRACT

A printed circuit board and a method for fabricating the same is provided. A substrate having a core layer and a plurality of pairs of bond pads thereon is prepared with at least one opening formed on the core layer between each pair of the bond pads. A solder mask layer covers the core layer and fills the openings, with recessed portions formed at positions of the solder mask layer on the openings during curing of the solder mask layer. When a small passive component is mounted on the printed circuit board, a space is formed between the bottom of the passive component and the recessed portions of the solder mask layer. An encapsulating resin can flow into the space to form an insulating barrier between the bond pads to prevent bridging between the bond pads and short circuiting of the passive component.

20 Claims, 5 Drawing Sheets

PRINTED CIRCUIT BOARD AND METHOD FOR FABRICATING THE SAME

FIELD OF THE INVENTION

The present invention relates to printed circuit boards and methods for fabricating the same, and more particularly, to a printed circuit board for accommodating 0201-type or smaller passive components that are electrically connected to the printed circuit board, and a method for fabricating the printed circuit board.

BACKGROUND OF THE INVENTION

To achieve desirable electricity and functionality, it is usually required to incorporate passive components such as capacitor, resistor, or inductor in a semiconductor package.

As electronic products have been developed toward small size and low energy consumption, the passive components for the electronic products should also be reduced in profile. Conventional insert-type passive components are mounted on a front side of a circuit board in a manner that the circuit board is in advance formed with holes, to allow leads of the passive components to be inserted into the holes and bonded to a back side of the circuit board. However, such passive components have a relatively large size, the leads cannot be closely arranged because of the electrical shortage issue, and the penetrating holes limit the routability of the substrate, making the insert-type passive components gradually replaced by SMT (surface mount technology) passive components.

SMT passive components have a modified structure as compared to the insert-type passive component. FIG. 5 shows a bonding status between a SMT passive component and a substrate. As shown, a pair of bond pads 11' that are properly spaced apart from each other are formed on a predetermined area (usually around a chip) on the substrate and exposed from a solder mask layer 2' applied over the substrate. After a proper amount of solder paste (not shown) is applied on the bond pads 11', two ends 31' of the passive component 3' are respectively adhered and secured to the solder paste by a reflow soldering process, allowing the passive component 3' to be electrically connected to the substrate via the solder paste.

However, since the applied amount of solder paste and the height of the solder paste after being reflow-soldered are difficult to be precisely controlled, and the solder mask layer is hardly achieved with perfect planarity, a clearance of 10 to 30 μm in height is usually formed between the passive component 3' and the solder mask layer 2'. Such a clearance is dimensionally smaller than the particle size of fillers of an encapsulating resin used for forming an encapsulation body to encapsulate the passive component. Therefore, during a molding process for fabricating the encapsulation body, the clearance underneath the passive component cannot be filled completely by the encapsulating resin. As a result, during a subsequent high-temperature processes such as solder-ball implantation or surface mounting, the solder paste on the two bond pads would be melted under the high temperature and flow into the clearance by capillary action, thereby causing bridging between the two bond pads and short circuit of the passive component, and undesirably degrading the quality and yield of the fabricated products.

Accordingly, U.S. Pat. No. 6,521,997 discloses a substrate formed with a groove thereon, as shown in FIG. 6. The groove is formed through a portion I of the solder mask layer between the pair of bond pads, and is sized to allow the encapsulating resin to pass through the groove. However, the groove has a size limit of a minimum width of 150 μm due to low resolution of the photosensitive solder mask, making formation of such a groove become difficult for a substrate or component that is getting smaller in size.

Current passive components used in BGA (ball grid array) semiconductor packages are mostly of 0603-type or 0402-type, wherein the number indicates the dimensions (length and width) of the passive component, for example of 0402, "04" representing the length (inch), and "02" representing the width (inch). In other words, 0402-type passive component has a length of 0.040 inch (about 1000 μm) and a width of 0.020 inch (about 500 μm), and generally has a thickness of about 500 μm.

As shown in FIG. 7, in the use of a 0402-type passive component for a small semiconductor package, the portion I of the solder mask layer between the two bond pads is 400 μm wide (i.e. the spacing between the exposed bond pads), and provided that the groove is 150 μm wide, a distance between the exposed bond pad and the groove is calculated to be (400−150)/2=125 μm. However, since the semiconductor package is still becoming even smaller in size with the encapsulation body of a current TFBGA (thin and fine ball grid array) package being reduced down to 530 μm in thickness, the 0402-type passive component having a thickness of 500 μm is no longer suitable for the TFBGA package and thus replaced by a smaller 0201-type passive component to comply with the reduced size of the TFBGA package.

The length, width and thickness of 0201-type passive component are all half of those of 0402-type passive component; that is, 0201-type passive component is sized 500 μm long×250 μm wide×250 μm thick. The spacing between the pair of exposed bond pads on the substrate is accordingly reduced to 275 μm; provided that the groove is 150 μm wide, a distance between the exposed bond pad and the groove is calculated to be only (275−150)/2=62.5 μm. The photosensitive solder mask is filled between the exposed bond pad and the groove. However, due to the low resolution of the photosensitive solder mask, which limits the manufacturing accuracy, the solder mask layer is very difficult to be filled in such a small space (62.5 μm wide) between the exposed bond pad and the groove. In other words, the above substrate having the groove and suitable for the 0201-type passive component cannot be fabricated by the conventional technology.

Therefore, the problem to be solved here is to provide a substrate for accommodating 0201-type passive or smaller SMT components without leaving a clearance between the passive component and a solder mask layer on the substrate thereby eliminating the occurrence of electrical bridging between two bond pads on the substrate where the passive component is bonded.

SUMMARY OF THE INVENTION

A primary objective of the present invention is to provide a printed circuit board and a method for fabricating the same, the printed circuit board suitable for accommodating 0201-type or smaller SMT passive components, which can avoid the difficulty of the prior art in forming a groove underneath the passive component for receiving an encapsulating resin in the groove.

Another objective of the invention is to provide a printed circuit board and a method for fabricating the same, the printed circuit board suitable for accommodating 0201-type or smaller SMT passive components, which can prevent the occurrence of electrical bridging between adjacent bond pads on the printed circuit board where the passive components are bonded.

A further objective of the invention is to provide a printed circuit board and a method for fabricating the same, the printed circuit board suitable for accommodating 0201-type or smaller SMT passive components, which can eliminate formation of voids between the passive components and a solder mask layer applied over the printed circuit board.

In order to achieve the foregoing and other objectives, the present invention proposes a method for fabricating a printed circuit board for accommodating 0201-type or smaller SMT passive components. This fabrication method comprises the steps of: preparing a substrate having at least one core layer and a plurality of pairs of bond pads formed on the core layer, wherein at least one opening is formed on the core layer between each pair of the bond pads; applying a solder mask material on the substrate to cover the core layer and fill the openings, and curing the solder mask material to form a solder mask layer, with recessed portions formed at positions of the solder mask layer on the openings, wherein the bond pads are exposed from the solder mask layer; mounting at least one passive component on at least one pair of the bond pads, with a space formed between the bottom of the passive component and the recessed portions of the solder mask layer; and applying an encapsulating resin to fill the recessed portions of the solder mask layer through the space and encapsulate the passive component.

The printed circuit board fabricated by the foregoing method can be a packaging substrate, motherboard or circuit board, for accommodating semiconductor chips and passive components such as 0201-type or smaller passive components in a TFBGA (thin and fine ball grid array) semiconductor package. This printed circuit board comprises: a substrate having at least one core layer and a plurality of pairs of bond pads formed on the core layer, wherein at least one opening is formed on the core layer between each pair of the bond pads; a solder mask layer applied over the substrate to cover the core layer and fill the openings, with recessed portions formed at positions of the solder mask layer on the openings, wherein the bond pads are exposed from the solder mask layer; a passive component mounted to at least one pair of the bond pads, with a space formed between the bottom of the passive component and the recessed portions of the solder mask layer; and an encapsulating resin for filling the recessed portions of the solder mask layer and encapsulating the passive component.

In comparison with the prior art where the forming of a groove between two bond pads is limited by the resolution of solder mask layer, the present invention provides a method to firstly form at least one opening (such as through hole or slot hole) on the core layer between each pair of bond pads, and then apply a solder mask material over the core layer, with the openings filled with the solder mask material. During curing of the solder mask material to form a solder mask layer, the solder mask material at the openings would shrink to form recessed portions, such that, when a passive component is mounted to the bond pads, a space is formed between the bottom of the passive component and the recessed portions of the solder mask layer. During a molding process, an encapsulating resin can smoothly flow into the space to provide an insulating barrier between the bond pads without forming voids. The insulating barrier prevents the occurrence of electrical bridging between the bond pads and short circuit of the passive component.

BRIEF DESCRIPTION OF THE DRAWINGS

The invention can be more fully understood by reading the following detailed description of the preferred embodiments, with reference made to the accompanying drawings, wherein.

DETAILED DESCRIPTIONS OF THE PREFERRED EMBODIMENT

The preferred embodiment of a printed circuit board and a fabrication method thereof proposed in the present invention is described in detail as follows with reference to FIGS. 1 to 4.

The printed circuit board can be a packaging substrate, motherboard, or any other type of circuit board for accommodating semiconductor chips and/or active or passive components thereon. Preferably, a substrate for a TFBGA (thin and fine ball grid array) semiconductor package is illustrated in this embodiment to improve the bonding reliability of a 0201-type or a smaller passive component and the substrate through the use of the current substrate fabrication technology. The accompanying drawings provided herein are made in simplicity in terms of the number and size of the elements for the printed circuit, and it should be understood that the practical structure of the printed circuit board is much more complicated.

Figure 1:
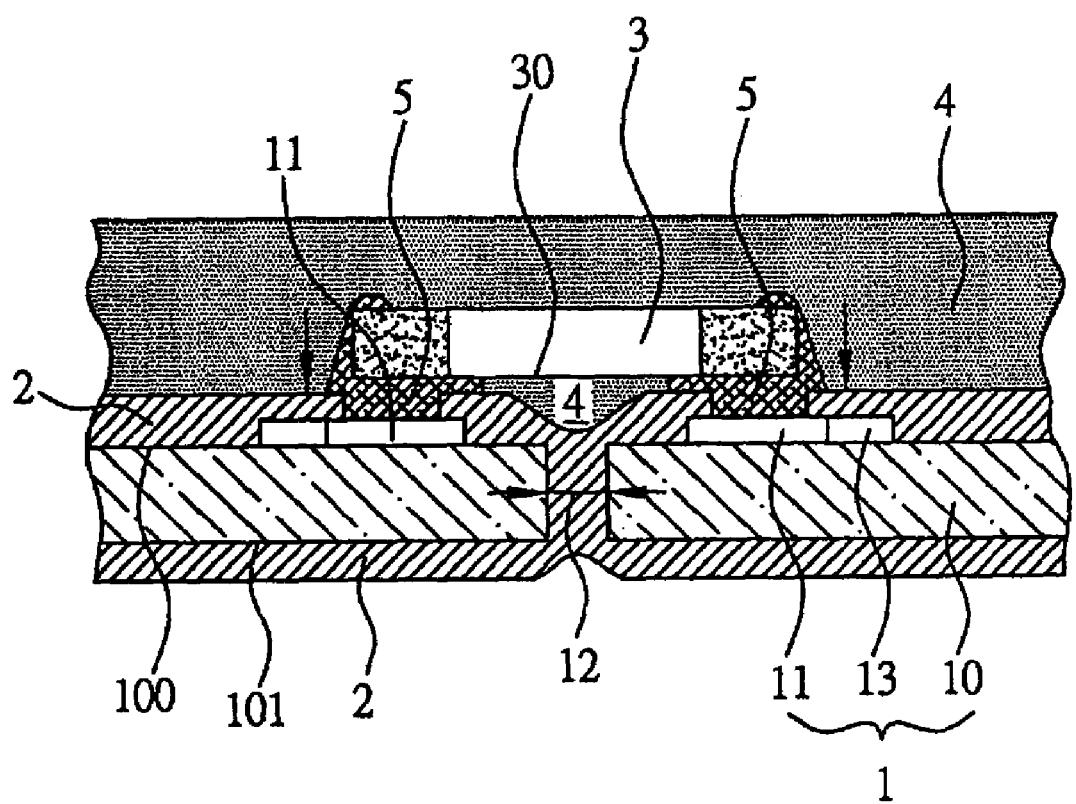
FIG. 1 is a partial cross-sectional view of a semiconductor package having a printed circuit board mounted with a 0201-type passive component thereon in accordance with the invention.

As shown in FIG. 1, the printed circuit board according to the invention comprises a substrate 1 having at least one core layer 10 and a plurality of pairs of bond pads 11 formed on the core layer 10, wherein at least one opening 12 is formed on the core layer 10 between each pair of the bond pads 11; a solder mask layer 2 applied over the substrate 1 to cover an upper surface 100 and a lower surface 101 of the core layer 10 and fill the openings 12; a passive component 3 bonded to at least one pair of the bond pads 11, allowing a space to be formed between the bottom 30 of the passive component 3 and the solder mask layer 2 at the openings 12; and an encapsulating resin 4 having fluidity flowing through the space between the passive component 3 and the solder mask layer 2 to encapsulate the passive component 3.

A dual-layer printed circuit board is exemplified for the detail description of a method for fabricating the printed circuit board in accordance with the invention.

Figure 2A:
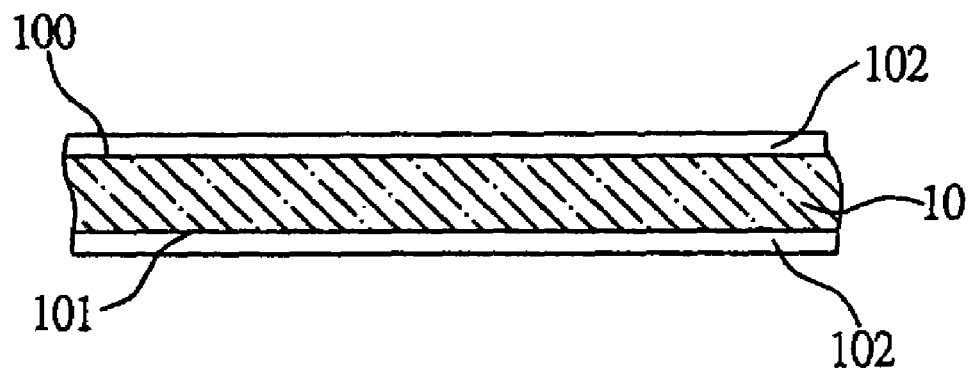
FIGS. 2A–2E are a flowchart showing the procedural steps of a method for fabricating the printed circuit board in accordance with the invention.
Figure 2B:
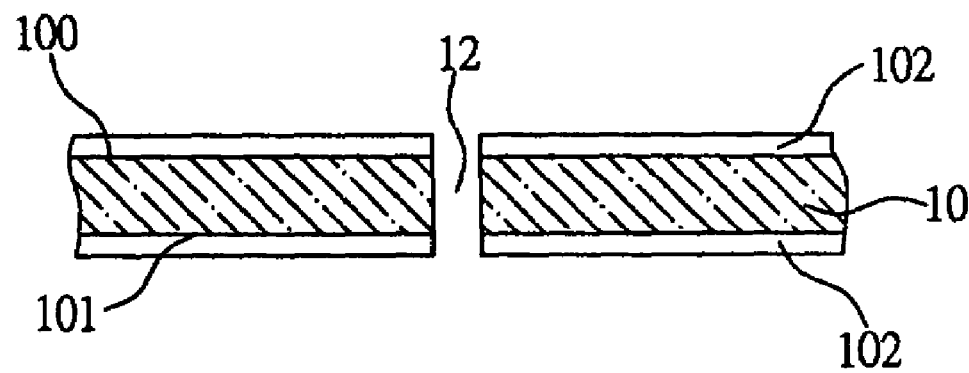
Figure 2C:
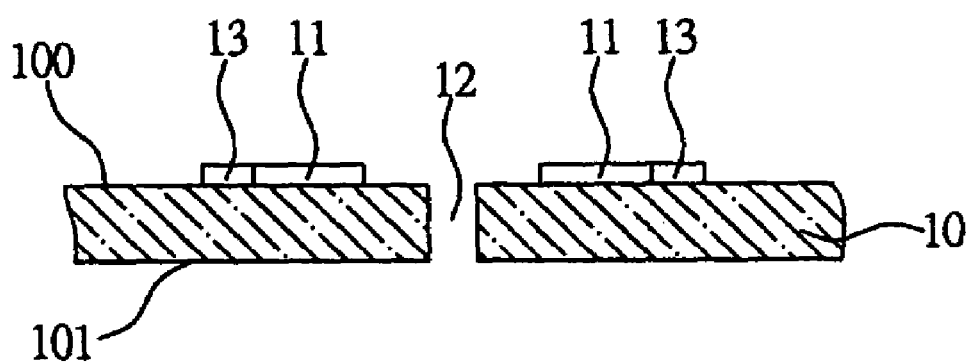

Referring to FIGS. 2A, 2B and 2C, the first step is to prepare at least one substrate 1. The substrate 1 comprises at least one core layer 10, a plurality of pairs of bond pads 11 formed respectively on an upper surface 100 and a lower surface 101 of the core layer 10 (only the bond pads 11 on the upper surface 100 are shown), and a circuit pattern 13 for electrically interconnecting the bond pads 11. The core layer 10 can be made of an organic polymer such as FR-4 resin, FR-5 resin, BT (bismaleimide triazine) resin, polyimide resin or so on. A copper foil 102 or a resin coated copper (RCC) layer is applied on the upper surface 100 and the lower surface 101 of the core layer 10, and subject to mechanical processing, laser- or plasma-drilling, and electroplating, to form a plurality of openings 12 at predetermined positions on the core layer 10. Then, a patterning process is performed to form the plurality of pairs of bond pads 11 on the substrate 1, with each pair of the bond pads 11 having at least one of the openings 12 therebetween. It should be noted that the openings 12 are not limited to through holes or slot holes, but may also be recessed portions formed at the predetermined positions on the core layer 10 in the present invention.

Figure 2D:
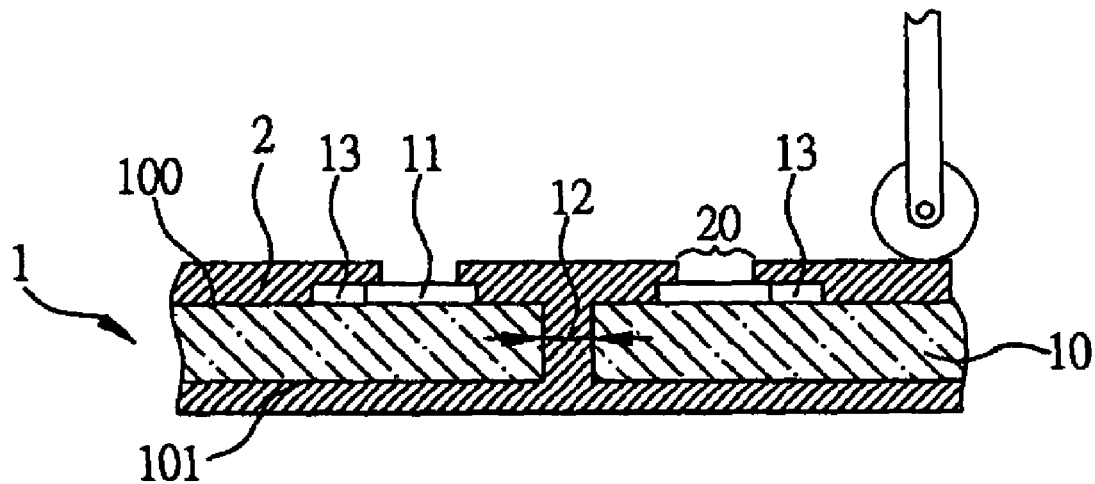

Referring to FIG. 2D, then a solder mask layer 2 is applied over the substrate 1 to fill the openings 12 and cover the upper and lower surfaces 100, 101 of the core layer 10 and the circuit pattern 13, wherein the solder mask layer 2 is formed with a plurality of holes 20 to expose the bond pads 11. The solder mask layer 2 can be made of a polymer having high fluidity such as epoxy resin, etc. Polymerization of the polymer generally includes three stages. A stage is a prepreg state in which the liquid polymer, hardening agents and catalysts are well mixed. B stage is a pretreatment state in which the liquid mixture from the A stage is heated and pressurized to be semi-polymerized to form a semi-cured resin. Finally, C stage is a total treatment state in which the semi-cured resin keeps being heated and pressurized to be completely polymerized and cured. The solder mask layer 2 applied over the substrate 1 can be a photosensitive, thermosetting or UV-cured solder mask of an allyl-epoxy resin, comprising a polymer (such as resin) for the A stage, photosensitizing agent, stabilizer, polymerization promotor, insulating material, and coating spreader. In this embodiment, a photosensitive allyl-epoxy resin is preferable for the solder mask layer 2.

The solder mask layer 2 is applied generally by screen printing, spraying, mask-encapsulating, spin-coating or roller coating which are known in the art and thus not to be further detailed herein. As shown in FIG. 2D, after a liquid solder mask material 2 (designated by the same reference numeral as the solder mask layer 2) is evenly spread on the substrate 1 with the openings 12 completely filled with the solder mask material 2, the patterning process (including exposure, development, etc.) and the treatment of UV irradiation or heating are performed to cure the liquid solder mask layer 2 (A stage) to form the cured solder mask layer 2 (C stage).

Figure 2E:
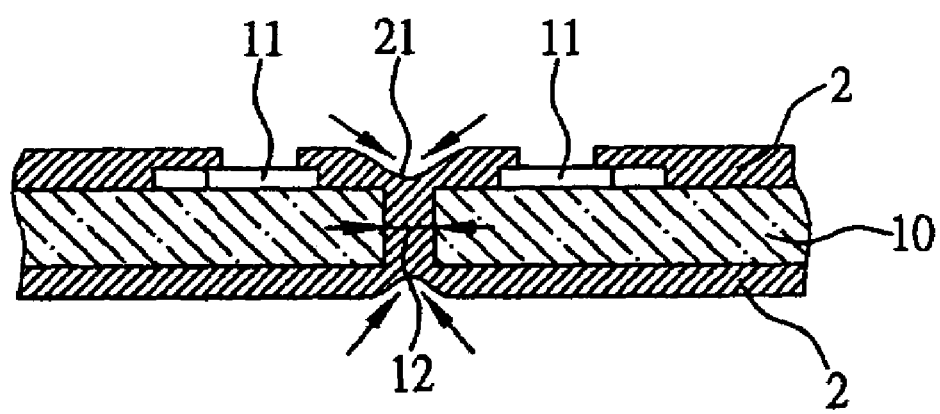

Referring to FIG. 2E, when the solder mask material 2 absorbs UV light or heat energy, it starts to become cured and shrunken. As a result, the solder mask material 2 in the openings 12 would be shrunken along the arrows in FIG. 2E, forming a recessed portion 21 at a position of the cured solder mask layer 2 on each opening 12 as compared to the rest of the solder mask layer 2.

Figure 3:
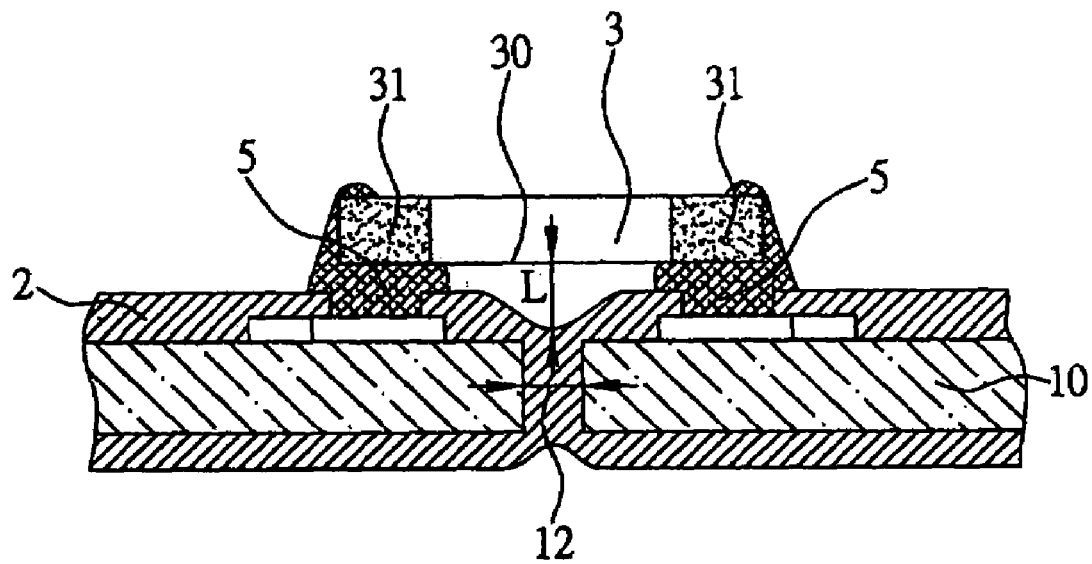
FIG. 3 is a cross-sectional view of the printed circuit board mounted with a 0201-type passive component thereon in accordance with the invention.
Figure 4:
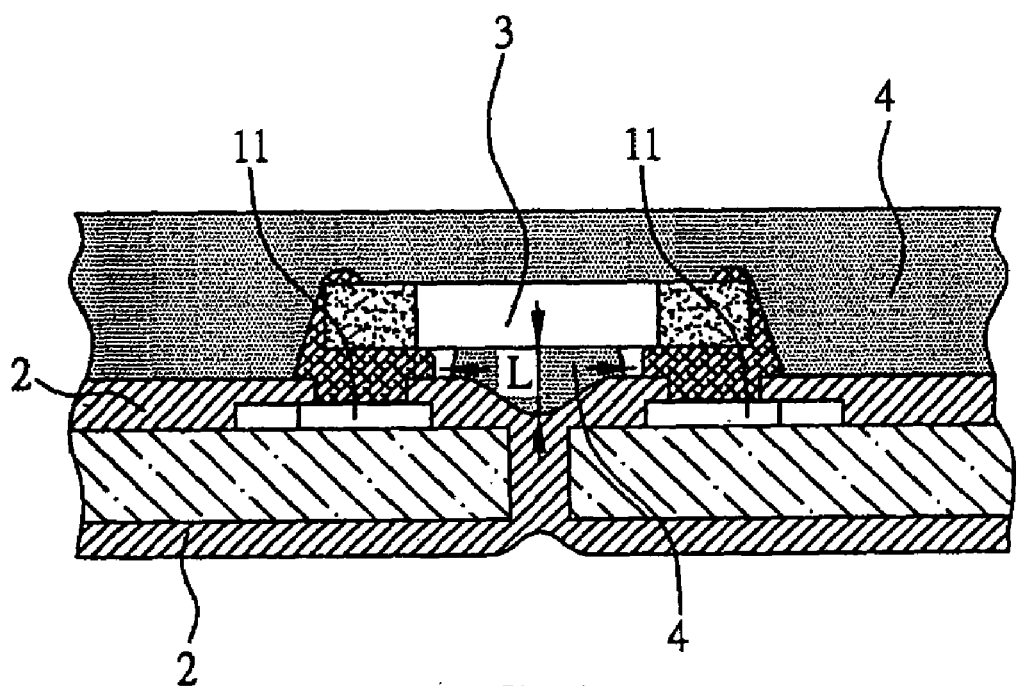
FIG. 4 is a cross-sectional view of the printed circuit board mounted with a 0201-type passive component thereon during a molding process in accordance with the invention.
Figure 5:
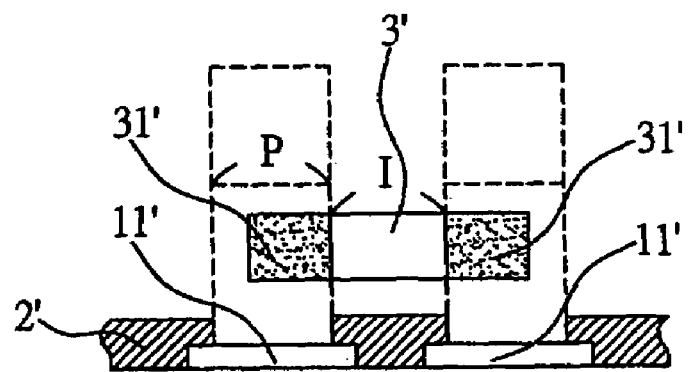
FIG. 5 (PRIOR ART) is a cross-sectional view of a conventional substrate for accommodating a 0402-type passive component.
Figure 6:
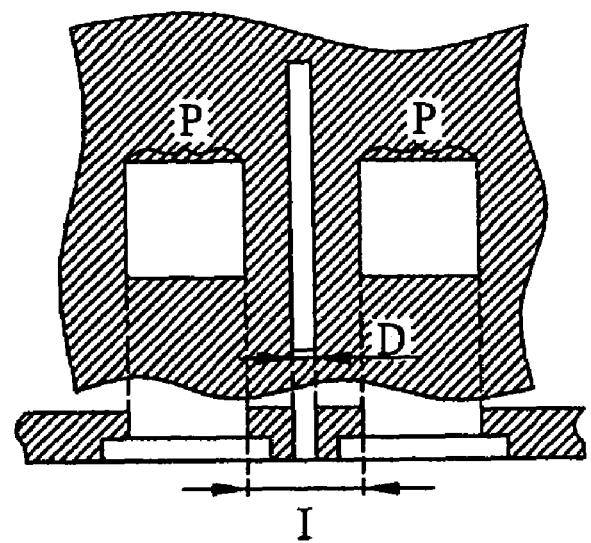
FIG. 6 (PRIOR ART) is a cross-sectional view of a conventional substrate having a groove formed between two bond pads as disclosed in U.S. Pat. No. 6,521,997.
Figure 7:
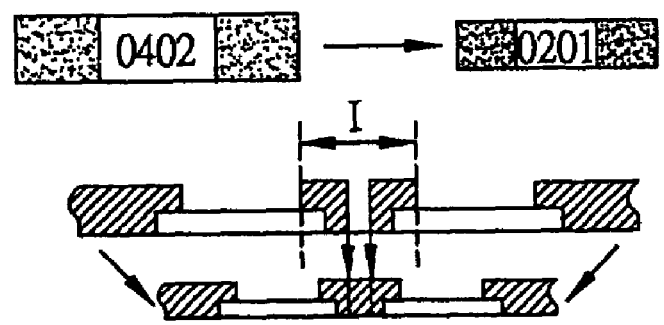
FIG. 7 (PRIOR ART) is a cross-sectional view showing comparison between the 0402-type passive component and the 0201-type passive component being bonded to the substrate respectively.

The above fabricated printed circuit board can used in a TFBGA package for accommodating 0201-type or smaller passive component such as 0201-type capacitor, 0201-type resistor or 0201-type inductor. As shown in FIG. 3, ends 31 of a 0201-type or smaller passive component 3 are attached to at least one pair of the bond pads 11 via a solder paste 5, with a space L formed between the bottom 30 of the passive component 30 and the solder mask layer 2 at the openings 12 of the core layer 10. As shown in FIG. 4, when the printed circuit board carrying the 0201-type or smaller passive component 3 is subject to a molding process, a melted encapsulating resin 4 having fluidity (such as epoxy resin, etc.), used for encapsulating a semiconductor chip (not shown) and the passive component 3, can flow through the space L between the passive component 3 and the solder mask layer 2 and fill the recessed portions of the solder mask layer 2. The height of the space L is larger than the diameter (around 3 mils) of fillers of the encapsulating resin 4, thereby providing an insulating barrier between the bond pads 11.

Referring back to FIG. 1, when the 0201-type or smaller passive component 3 mounted on the printed circuit board is subject to a reflow-soldering process, the solder paste 5 that melts under the high temperature of reflow-soldering is blocked by the insulating barrier and would not flow into the space between the passive component 3 and the solder mask layer 2, thereby preventing the occurrence of bridging between the bond pads 11 and short circuit of the passive component 3. Moreover, the recessed portion of the solder mask layer 2 at each opening 12 is formed by curing and shrinkage of the solder mask layer 2, providing a space between the bottom 30 of the passive component 3 and the solder mask layer 2 at the openings 12, such that the fillers of the encapsulating resin 4 can smoothly flow through the space and fill the recessed portion of the solder mask layer 2 without forming voids. Therefore, the present invention provides a printed circuit board suitable for 0201-type or smaller passive components through the use of the current fabrication technology, which avoids the difficulty of the prior art in forming a groove underneath the passive component for receiving an encapsulating resin in the groove.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a printed circuit board, comprising the steps of: preparing a substrate having at least one core layer and a plurality of pairs of bond pads formed on the core layer, wherein at least one opening is formed through out the substrate between each pair of the bond pads; and applying a solder mask material on the substrate to cover an upper surface and lower surface of the core layer and fill the openings, and curing the solder mask material to form a solder mask layer, with recessed portions formed at positions of the solder mask layer on the two ends of the openings, wherein the bond pads are exposed from the solder mask layer.

2. The method of claim 1, further comprising mounting at least one passive component on at least one pair of the bond pads, with a space formed between the bottom of the passive component and the recessed portions of the solder mask layer.

3. The method of claim 2, further comprising applying an encapsulating resin to fill the recessed portions of the solder mask layer through the space and encapsulate the passive component.

4. The method of claim 3, wherein a height of the space is larger than a diameter of fillers of the encapsulating resin.

5. The method of claim 4, wherein the height of the space is larger than 3 mils.

6. The method of claim 3, wherein the encapsulating resin has fluidity.

7. The method of claim 6, wherein the encapsulating resin is epoxy resin.

8. The method of claim 2, wherein the passive component is a 0201-type passive component or an even smaller passive component.

9. The method of claim 1, wherein the core layer is made of BT (bismaleimide triazine) resin or polyimide resin.

10. The method of claim 1, wherein the opening is formed by a laser-drilling process.

11. The method of claim 1, wherein the opening is a through hole or a slot hole.

12. A printed circuit board, comprising:
- a substrate having at least one core layer and a plurality of pairs of bond pads formed on the core layer, wherein at least one opening is formed throughout the substrate between each pair of the bond pads; and
- a solder mask layer applied over the substrate to cover an upper surface and a lower surface of the core layer and fill the opening between each pair of the bond pads, with recessed portions formed at positions of the solder mask layer on two ends of the opening, wherein the bond pads are exposed from the solder mask layer.

13. The printed circuit board of claim 12, further comprising a passive component mounted on at least one pair of the bond pads, with a space formed between the bottom of the passive component and the recessed portions of the solder mask layer; and an encapsulating resin for filling the recessed portions of the solder mask layer and encapsulating the passive component.

14. The printed circuit board of claim 13, wherein a height of the space is larger than a diameter of fillers of the encapsulating resin.

15. The printed circuit board of claim 14, wherein the height of the space is larger than 3 mils.

16. The printed circuit board of claim 13, wherein the passive component is a 0201-type passive component or an even smaller passive component.

17. The printed circuit board of claim 13, wherein the encapsulating resin has fluidity.

18. The printed circuit board of claim 17, wherein the encapsulating resin is epoxy resin.

19. The printed circuit board of claim 12, wherein the core layer is made of BT (bismaleimide triazine) resin or polyimide resin.

20. The printed circuit board of claim 12, wherein the opening is a through hole or a slot hole.

* * * * *